United States Patent [19]
Freeman

[11] Patent Number: 4,490,630
[45] Date of Patent: Dec. 25, 1984

[54] CURRENT SWITCH EMITTER FOLLOWER WITH CURRENT MIRROR COUPLED PUSH-PULL OUTPUT STAGE

[75] Inventor: Leo B. Freeman, Poughkeepsie, N.Y.

[73] Assignee: International Business Machines Corporation, Armonk, N.Y.

[21] Appl. No.: 393,835

[22] Filed: Jun. 30, 1982

[51] Int. Cl.[3] .............. H03K 19/003; H03K 19/086; H03K 17/08

[52] U.S. Cl. .................................. 307/455; 307/262; 307/270; 307/473

[58] Field of Search ............... 307/455, 467, 473, 270, 307/262, 475

[56] References Cited

U.S. PATENT DOCUMENTS

| | | |
|---|---|---|
| 3,624,417 | 11/1971 | Dao . |
| 3,757,138 | 9/1973 | Bhatia et al. . |
| 3,828,206 | 8/1974 | Zuk . |
| 3,906,212 | 9/1975 | Poguntke . |
| 3,909,636 | 9/1975 | Masaki et al. . |
| 3,916,215 | 10/1975 | Gaskill, Jr. et al. . |
| 3,955,099 | 5/1976 | Gaskill, Jr. et al. . |
| 4,004,170 | 1/1977 | Henke . |
| 4,057,739 | 11/1977 | Otake . |
| 4,065,678 | 12/1977 | Reese et al. . |
| 4,346,312 | 8/1982 | Christopherson ............ 307/455 |
| 4,376,900 | 3/1983 | Metzger ....................... 307/455 |

OTHER PUBLICATIONS

IBM-TDB vol. 15, No. 2, Jul. 1972, pp. 507-508, "High-Speed Push-Pull Driver", H. E. Barsuhn et al.
IBM-TDB vol. 16, No. 11, Apr. 1974, p. 3601, "Current Switch 'Totem Pole'", A. E. Barish et al.
IBM-TDB vol. 18, No. 3, Aug. 1975, pp. 706-709, "Predistorting Transmission Line Driver", A. X. Widmer.
IBM-TDB vol. 18, No. 5, Oct. 1975, p. 1406, "Emitter-Collector Drive Circuit", J. W. Bode et al.
IBM-TDB vol. 20, No. 1, Jun. 1977, pp. 319-320, "EIA Level Cable Driver", A. S. Myers, Jr.
IBM-TDB, vol. 20, No. 4, Sep. 1977, pp. 1453-1454, "True/Complement Driver Circuit", R. W. Knepper.

*Primary Examiner*—John Zazworsky
*Attorney, Agent, or Firm*—Theodore E. Galanthay; John A. Jordan

[57] ABSTRACT

Disclosed is a high performance current switch push-pull driver circuit. A first output of the current switch is direct coupled to the push-pull driver while the second output of the current switch is coupled to the push-pull driver by means of an emitter follower and current mirror. Emitter followers connected to the current switch provide a first pair of true/complement outputs while push-pull drivers provide a second set of true/complementary outputs having a higher drive capability. The current mirror is biased near its turn on potential providing current control switching of the current mode transistor and the push-pull driver transistor with which it is coupled. The circuit is greatly tolerant for varying load conditions, is protected against short circuit and power supply failures and has means for three state operation.

18 Claims, 3 Drawing Figures

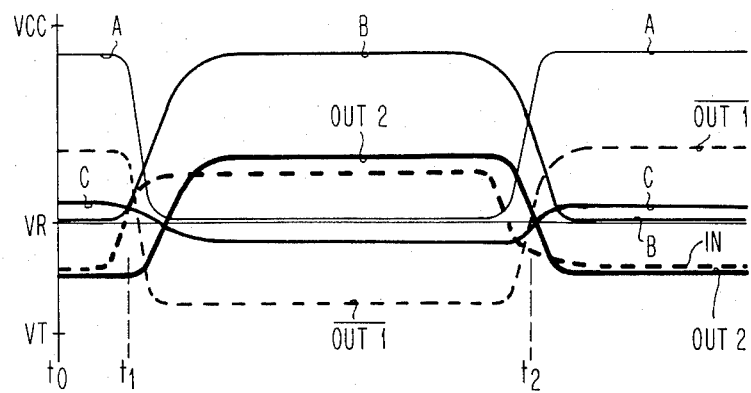
FIG. 2
FIG. 3
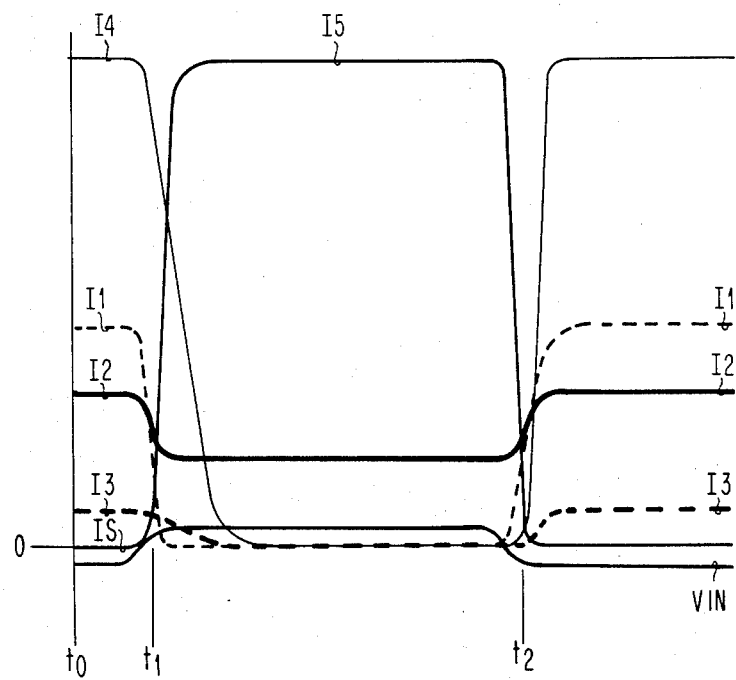

CURRENT SWITCH EMITTER FOLLOWER WITH CURRENT MIRROR COUPLED PUSH-PULL OUTPUT STAGE

DESCRIPTION

Field of the Invention

This invention relates to a current switch emitter follower circuit with a current mirror coupled push-pull output stage providing true and complementary outputs. The circuit operates at high speed, provides both on and off chip drive capability and is advantageously fabricatable in integrated circuit technology.

Cross References, Related Patents and Applications

1. Bhatia et al, U.S. Pat. No. 3,757,138, issued Sept. 4, 1973, entitled: "Push-Pull Line Driver Circuit".
2. Barsuhn et al, IBM Technical Disclosure Bulletin, dated July 1972, pages 507–508, entitled: "High-Speed Push-Pull Driver".
3. Knepper, IBM Technical Disclosure Bulletin, dated September 1977, Pages 1453–1454, entitled: "True/Complement Driver Circuit".

Background of the Invention

Current switch circuits are notoriously well known in the art, having first been described in Yourke, U.S. Pat. No. 2,964,652. In its most basic form, a current switch includes first and second transistors having their emitters connected in common and to a substantially constant source of current. The base of one of the two transistors is connected to a reference potential; while the base of the other transistor receives an input signal. Collector load devices are connected to each of the transistors. One of the two transistors conducts the constant current provided by the current source, depending on whether the input signal potential level is higher or lower than the reference potential level. True and complement outputs are available at the respective collectors. The output of the current switch circuits is frequently connected to an emitter follower, resulting in a current switch emitter follower (CSEF), also known as current mode logic.

It is also known in the art to connect a current switch emitter follower to a push-pull driver circuit. Various circuit arrangements in which current switch emitter follower circuits are connected to a push-pull driver are described in each of the above noted references. As will become apparent, none of these references suggest coupling a current switch emitter follower to a push-pull driver by way of a current mirror and for this reason they collectively fail to provide the advantageous features and advantages of the present invention.

Summary of the Invention

Accordingly, it is a primary object of this invention to provide an improved high performance current switch emitter follower circuit with push-pull output that is uniquely adapted for integrated circuit fabrication.

It is another object of this invention to provide a true complement generator that provides varying levels of output drive, for example both on chip and off chip drive capability.

It is still another object of this invention to provide a driver circuit that will not fail under catastrophic conditions such as a short circuit at the output, or power supply failure.

Lastly, it is an object of this invention to provide a driver having a three-state capability with means for disabling the off chip driver.

These and other objects of this invention are achieved with a current mirror interface between a current switch emitter follower and a push-pull driver. The current switch circuit includes first and second transistors having their emitters connected in common and to a substantially constant source of current. Third and fourth transistors each having their base electrode connected to the collector of the first and second transistors, respectively, form emitter follower circuits providing a first pair of complementary output signals at their emitter electrodes. A push-pull driver including fifth and sixth transistors is connected to the current switch emitter follower output such that the base of the fifth transistor is connected to the collector of the second transistor and the base of the sixth transistor is coupled to the emitter of the third transistor by way of a current mirror.

Brief Description of the Drawings

FIG. 2 is a voltage waveform diagram describing the operation of the FIG. 1 circuit.

FIG. 3 is a current waveform diagram describing the operation of the FIG. 1 circuit.

Description of the Preferred Embodiment

Figure 1:
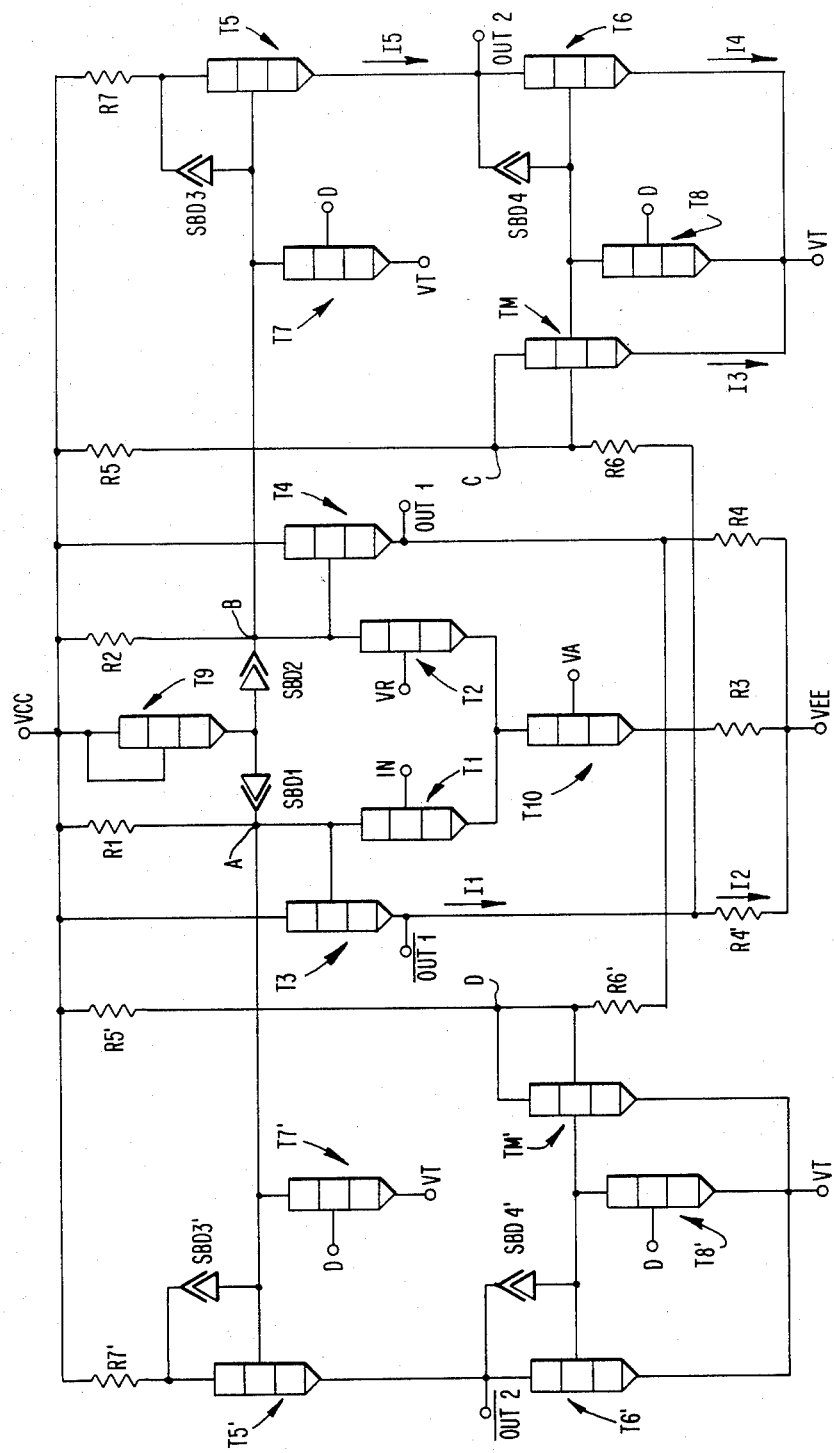
FIG. 1 is a schematic circuit diagram of the invention.

Refer now to FIG. 1 for a description of the preferred embodiment. The current switch circuit includes first and second transistors T1 and T2 having their emitters connected in common and to a substantially constant source of current. The base electrode of T2 is connected to a reference potential VR while the base of T1 is connected to an input signal terminal IN. It is known to have a large number of transistors connected in parallel with transistor T1 to provide for a large number of inputs forming logic circuits such as NOR circuits, for example. The collector of T1 is connected to the base of emitter follower transistor T3; while the collector of T2 is connected to the base of emitter follower transistor T4. The collectors of T3 and T4 are connected to the power supply potential terminals VCC, the highest potential applied to the circuit. The emitter of T4 provides a true output signal at terminal OUT1 while at the emitter of T3 a complementary output is provided at terminal $\overline{OUT1}$. A first push-pull driver is provided by fifth and sixth transistors T5 and T6. The base of T5 is connected to the collector of T2, receiving the inphase (true) output of the current switch. The base of T6 is coupled to the collector of T1, by way of emitter follower T3 and current mirror transistor TM, receiving the out of phase (complementary) output of the current switch.

A true output signal is provided at terminal OUT2 between the emitter of T5 and collector of transistor T6.

The output OUT2 can be placed in a third state by means of disabling transistors T7 and T8. Transistor T7 is connected between the base of T5 and terminal VT. A disable signal at terminal D, connected to the base of T7, turns T7 on thus holding T5 off. Similarly, transistor T8 is connected between the base of T6 and terminal VT. A disable signal is also supplied to the terminal D of transistor T8 to turn T6 off.

The circuit is entirely symmetrical so that a complement output is provided by the second push-pull driver at the $\overline{OUT2}$ terminal between the emitter of transistor T5' and the collector of transistor T6'. In view of this noted symmetry, disable transistors T7' and T8' as well as current mirror transistor TM' have been labeled with corresponding reference numerals with prime notation. Diode connected transistor T9 is connected to terminal VCC and to Schottky barrier diodes SBD1 and SBD2. The series connection of T9 and SBD1 provide a down level collector clamp to node A, limiting the down level output from the collector of transistor T1. The series connection of T9 and SBD2 is connected to node B and provides a similar collector clamp for the collector of T2. Resistor R1 connected between VCC and node A is a collector resistor for T1 while resistor R2 connected between VCC and node B is the collector resistor for transistor T2. By varying the resistance of R1 and R2, and the constant current source, the power/performance ratio of the current switch can be varied. The constant current will flow either through the path defined by resistor R1, transistor T1, transistor T10 and resistor R3 or, alternatively in the right hand path defined by resistor R2, transistor T2 and the constant current source provided by the series connection of transistor T10 and resistor R3 connected to terminal VEE (the most negative potential available to the circuit). Transistor T10 receives at its base at terminal VA a reference potential that is temperature and power supply compensated as is the reference potential at terminal VR supplied to transistor T2. It is well known in the art to compensate the potential at both terminals VR and VA with respect to temperature and power supply variation as well as to maintain a desired relationship in the potential levels of the two reference potentials.

Resistor R4 connected between the emitter of T4 and terminal VEE is a pull-down resistor for emitter follower transistor T4. Resistor R5 is connected to VCC in series with resistor R6 which is connected to resistor R4'. Resistors R5 and R6 form a voltage divider at the common connection of the base and collector of current mirror transistor TM. This common node C formed by the collector and base of current mirror transistor TM and the common connected point of resistors R5 and R6 is normally clamped by current mirror transistor TM near a fixed potential that is one base to emitter ($V_{be}$) voltage drop above the potential terminal VT. The base of transistor TM is connected to the base of transistor T6, these two transistors being connected in a current mirror configuration. Since the potential at the base of T6 is clamped, its conductivity is current controlled. More particularly, the current through transistor TM and the current through transistor T6 will be directly proportional (mirror current ratio) to the emitter area ratio of these two transistors. Typically, if transistor T6 is made larger to have an emitter area ten times that of current mirror transistor TM, then transistor T6 will conduct ten times as much current as current mirror transistor TM.

Another feature of this circuit is current limiting resistor R7. In the event output terminal OUT2 is short circuited when transistor T5 is on, then resistor R7 connected between VCC and the collector of T5 will limit the current in the circuit path provided from VCC through R7 and T5. Transistor T5 also has a base to collector Schottky Barrier Diode clamp SBD3 that will limit the overdrive of the base, thereby preventing T5 from becoming saturated. Transistor T6 has a similar clamp SBD4. In the same way, the complementary output side of the circuit has SBD3' and SBD4' connected as antisaturation clamps for push-pull transistors T5' and T6', respectively. Also, resistor R7' provides current limiting to the complementary output to terminal. Lastly, resistors R5' and R6' provide a voltage divider function at node D to the common base-collector connection of current mirror TM'.

In addition to push-pull transistor T5 (and T5') being protected by current limiting resistor R7 (and R7'), transistors T6 and T6' are also protected. The protection of transistor T6, for example, is provided by its current mirror relationship to transistor TM. Regardless of short-circuit or other misconnections of the output terminal OUT2, the current through transistor T6 will bear a ratio to the current through transistor TM and will not be greater because of such a misconnection of terminal OUT2.

The push-pull driver outputs OUT2 and $\overline{OUT2}$ provide high drive currents and are suitable for off-chip drive. The emitter follower outputs OUT1 and $\overline{OUT1}$ (internal outputs) are usually connected to other circuits on the same chip. Thus, this circuit provides great flexibility in an integrated master slice layout configuration by providing several levels of drive capability within a circuit.

Operation

Having thus described the various circuit connections which are also apparent by reference to the schematic circuit diagram of FIG. 1, the operation will now be described. The operation of this invention is best understood by reference to the various voltage and current waveform diagrams. Assume that VCC is the most positive potential at approximately +1.4 volts and that VEE is the most negative potential at approximately −2.2 volts. Then terminal VT receiving potential VT is at an intermediate voltage of approximately −0.7 volts. With these power supply terminal potentials, reference potential VR should be near ground potential while reference potential VA is at approximately −0.6 volts.

The input potential at terminal IN varies symmetrically about the reference potential at terminal VR. With VR at approximately 0 volts, the input signal can vary plus or minus approximately 0.4 volts to switch the constant current through either T1 or T2.

Before proceeding with the exemplary parameters which will be offered by way of illustration and are not intended in any way to limit the scope of the invention, it appears helpful here to present a summary of the operation. As has already been noted, the true and complementary (in phase and out of phase) sides of this circuit are entirely symmetrical. For this reason, and in response to an up or down logic level at the input terminal, corresponding voltage levels of opposite phase will be present at corresponding nodes in the true and complementary sides of the circuit. Thus, the description of the logic states of one side of the circuit at a first input logic level are identical in the complementary side of the circuit with opposite logic input levels.

In the operation of the present circuit, the current control of current mirror transistor TM and correspondingly, push-pull transistor T6 is very significant to the overall operation. This is accomplished by maintaining node C near the turn on potential of transistor TM when TM is held off. This corresponds to the state when transistor T3 is off so that internal output terminal OUT1 is at its down level. In this state, the voltage divider network provided by the series connection of resistor R5, resistor R6, and resistor R4' connected between VCC and VEE sets the down level of terminal $\overline{OUT1}$ as well as the potential level of node C. The circuit balances itself at near turn-on threshold at node C. That is, if the voltage divider provides a slightly lower potential than required at node C, transistor TM is not held quite at its turn on potential. On the other hand, if node C goes very slightly above the turn on potential of transistor TM, a small current through TM will drop the potential at node C back to its turn-on threshold. Thus, transistor TM is off with its base collector contact clamped near one $V_{be}$ above terminal VT and push-pull transistor T6 is similarly off.

Rapid turn on of transistor TM is achieved when complementary internal terminal $\overline{OUT1}$ rises to its up level due to transistor T3 turning on. At this point, the potential at terminal $\overline{OUT1}$ is determined by transistor T3 so that the voltage divider now only includes resistor R5 and R6 connected in a series path between VCC and terminal $\overline{OUT1}$. This results in a reversal of current through resistor R6, this current turning transistor TM and transistor T6 on. The current through transistor T6 will be in a current mirror ratio to the current through transistor TM. As is well known, a current mirror works in both directions and stabilizes to adjust for a particular load condition at the output node. Thus, if the load provides insufficient current to terminal OUT2 to provide the required ratio, then current will pass from node C through Schottky Barrier Diode SBD4 to contribute collector current to transistor T6. In this way, the desired ratio of currents (e.g. 10:1) between T6 and TM is always maintained.

The turn off of transistor TM is as rapid as its turn on, since as soon as transistor T3 is turned off, terminal $\overline{OUT1}$ goes down and current through resistor R6 reverses pulling current out of node C. Since during the on state of transistor TM, carriers were stored in TM, the down going voltage transition of node C is slower than the up going voltage transition. This, however, does not effect the turn off time of transistor TM. With the very small voltage transitions required at node C, capacitive effects are minimized. Accordingly, the current mirror arrangement of transistor TM and push-pull transistor T6 together with Schottky Barrier Diode SBD4 provide high switching speed, large current drive capability, and a highly load tolerant output.

In the illustrative example of FIG. 2, the input potential is initially (at time $=t_o$) at a down level so that transistor T1 is off while transistor T2 is on. At this time, node A is up near VCC while node B is near or slightly above ground potential. (Without a load connected to OUT1 and/or OUT2, node A would be at VCC.) As previously mentioned, the down level of node B will be limited by the diode drop through transistor T9 and Schottky Barrier Diode SBD2. In the event the drop through T9 is 0.8 volts and the drop through SBD2 is 0.5 volts, then the down level of node B will be at 0.1 volts if VCC is precisely at 1.4 volts. Those skilled in the art will recognize that variations in load impedance, component characteristics, power supply and temperature will result in slightly varying voltage levels.

With transistor T1 off and node A at approximately 1.3 volts, emitter follower transistor T3 will be on and its output will be approximately one base to emitter drop below 1.3 volts. In practice, the up level of the emitter follower outputs, e.g. T3 will be about +0.5 to +0.7 volts. With transistor T1 off, transistor T2 is conducting, bringing node B down to slightly above ground potential, so that transistor T5 will be off. With the internal complementary output terminal $\overline{OUT1}$ at approximately 0.5 to 0.7 volts, the voltage divider of resistors R5 and R6 is adjusted to maintain node C at approximately 0.1 volts. As will become apparent, this is sufficient to cause current mirror transistor TM to conduct causing transistor T6 to also conduct, thereby bringing the true output terminal OUT2 to a down level of approximately −0.5 volts. The reason terminal OUT2 does not come all the way down to the potential of terminal VT is because of conduction by diode clamp SBD 4. With the base of T6 held at +0.1 volts, the output node OUT2 cannot drop more than the forward voltage drop of SBD 4 below 0.1 volts. Since the base of transistor T6 is always clamped at or near its $V_{be}$, slight variations in the voltage at node C result in a change in the conductive state of current mirror transistor TM and push-pull transistor T6; hence current control of T6.

As the input terminal is brought from its down to its up level at approximately time $t_1$, transistor T1 turns on while transistor T2 turns off. This causes node A to be brought to its down level while node B is brought to its up level. This brings the complementary internal output terminal $\overline{OUT1}$ down while the true internal output terminal OUT1 goes to its up level. With node B at its up level, transistor T5 turns on bringing terminal OUT2 to its up level of about +0.5 to +0.7 volts (1 $V_{be}$ below node B). At the same time, with terminal $\overline{OUT1}$ at its down level of approximately −0.5 to −0.7 volts, node C is brought slightly below ground potential turning TM and thereby T6 off. Although the illustrated voltage change takes place at node C, the rapid switching of transistor T6 is accomplished by current switching which will become more apparent with the description of the current waveforms of FIG. 3.

Continuing with the waveforms of FIG. 2, while the input terminal is at its up level and transistor T1 is on, T5' is off. At this same time, T2 is off so that T4 is on with output terminal OUT1 at its up level of about +0.5 to +0.7 volts. With T4 conducting, transistor TM' is also conducting so that transistor T6' is conducting. Accordingly, terminal $\overline{OUT2}$ is at its down level.

When the input terminal is brought back to its down level (at approximately time $t_2$ in FIG. 2), T1 is turned off and T2 is turned on. This brings node A up turning T5' on. With T2 on, node B is brought down turning T5 off. With node A up, T3 is on causing transistor TM to turn on turning transistor T6 on, thereby bringing node OUT2 to its down level. With node B down, internal terminal OUT1 is down so that transistor TM' is off and transistor T6' is off. Accordingly, terminal $\overline{OUT2}$ is at its up level.

The operation of this circuit will become even more apparent by examining the various currents in the circuit shown in the waveform diagram of FIG. 3. The voltage at the input terminal has been placed on this current diagram to correlate the various times $t_0$, $t_1$, and $t_2$ with the voltage waveform diagram of FIG. 2. Thus, with the input voltage at its down level, transistor T1 is off while transistor T2 is on. With transistor T1 off, node A is at its up potential so that transistor T3 is on. With transistor T3 on, the $\overline{OUT1}$ terminal is up and transistor T3 is conducting current. The current conducted by T3 is of such magnitude that in addition to providing an output current at terminal $\overline{OUT1}$, current I1 flows through the emitter circuit in the direction indicated. As noted in the waveform diagram at time $t_0$, I1 is greater than I2 (flowing through R4') so that a current equal to I1 minus I2 flows up through resistor R6 into node C. Current I3 passing through transistor TM causes a corresponding current I4 to pass through transistor T6. Assuming a current gain ratio of 10:1, current I4 will be ten times as large as current I3. At this point in time, of course, transistor T6 is on.

Transistor T5 is off and since T5 and T6 are connected in a push-pull configuration, terminal OUT2 is at its down level. At the complementary terminal $\overline{OUT2}$, transistors T5' and T6', of course, are at their opposite states of conduction so that the terminal $\overline{OUT2}$ is at its up level.

Assume now that at approximately time $t_1$, the input terminal is brought to its up level. This causes transistor T1 to turn on, turning T2 off so that node A comes down while node B goes up. When node B goes up, transistors T5 and T4 turn on to bring the true output terminals OUT1 and OUT2 to their up levels. At the same time, with node A coming to a down level transistor T3 is turned off. With transistor T3 off, I1 becomes 0 amps so that the current through resistor R6 reverses and passes down through R6. At this point TM is turned off so that I3 also becomes equal to 0. Thus, the amplitude of current is determined by the series connection of R5, R6 and R4' across VCC and VEE. Thus, the current passing down through R6 at this point in time will be equal to I2. For proper operation of the circuit, the current through R6 will always reverse and be approximately equal to 1.5-2 milliamps (passing either up or down through the illustrated resistor). Since current mirror transistor TM conducts no current, transistor T6 is also off.

The resistance values for resistors R5, R6, and R4' should be adjusted to provide the aforementioned voltage and current amplitudes. With transistor T3 off, the up level of terminal $\overline{OUT1}$ is determined by current I2 passing through R4'. Current I2 (when T3 is off) is determined by the total resistance in the series path including resistor R5, R6 and R4' between VCC and VEE. In the present example, these values have been adjusted so that the terminal OUT1 has a down level of approximately −0.5 to −0.7 volts. This requires a voltage drop of approximately 1.5 to 1.7 volts through resistor R4'. This is provided by a current of approximately 1.5-2 milliamps through a resistance in R4' of approximately 830 ohms. With R5 at approximately 800 ohms and R6 at approximately 300 ohms, a potential of approximately −0.1 volts is realized at node C. When T3 is turned on, the terminal $\overline{OUT1}$ rises to approximately +0.5 to +0.7 volts causing a current of approximately 1.5-2 milliamps to pass through resistor R6 bringing node C to approximately +0.1 volts with a resultant current I3 passing through current mirror transistor TM. The resultant current I3 is the sum of the currents flowing into node C less collector current contributed to T6 through SBD4.

These exemplary values of voltage and current are also obtained in the left branch of the circuit in which node D corresponds to node C and R5' is set equal to R5, R6' is set equal to R6 and R4' is set equal to R4. In this way current mirror transistor TM' controls the conduction and nonconduction (and resultant potential at terminal $\overline{OUT2}$) in the same manner that current mirror transistor TM controls transistor T6.

Continuing with the description of FIG. 3, when the input terminal is brought to a down level at approximately time $t_2$, transistor T1 turns off while transistor T2 turns on. As transistor T2 turns on, node B is brought to a down level turning off transistor T5. With transistor T5 off, current I5 becomes 0 amps. With the turning on of transistor T6, terminal OUT2 will then be brought to a down level as follows. With transistor T1 off, transistor T3 is turned on causing current to flow up through transistor R6 bringing node C to an up level. The current through R6 at this point in time is equal to I1 minus I2, I1 being larger than I2. This current coming up through transistor R6 in addition to the current coming down through transistor R5 pass through current mirror transistor TM as current I3 and through SBD4 as collector current in T6. A multiple of current I3 based on the ratio of emitter area of T6 and TM passes through transistor T6 as current I4 which provides the desired current drive and voltage down level at terminal OUT2.

At the same time that T5 is turned off and T6 is turned on, T5' is turned on and T6' is turned off. With transistor T1 off, node A rises causing transistor T5' to turn on. At the same time, with transistor T2 on, node B is down so that transistor T4 is off with terminal OUT1 at its down level. In this state, the current through R4 equals the current down through R6' which brings node D down in a similar fashion as described in detail for node C. This causes transistor TM' to be non-conducting which also results in transistor T6' to be non-conducting. In this state, the terminal $\overline{OUT2}$ is at its up level.

A further feature of the present circuit is the ability to provide a three state output at terminal OUT2 and $\overline{OUT2}$. These outputs are disabled by an up level signal D at the base electrodes of transistors T7, T7', T8, and T8'. With these four transistors on, the base terminals of all four push-pull transistors T5, T5', T6, and T6' are at a down level, turning these transistors off. In this "third state" the terminals OUT2 and $\overline{OUT2}$ are floating. This is highly advantageous in a number of situations. For example, if these terminals are the output terminals of the chip, testing is greatly facilitated.

What has then been described is a current switch emitter follower circuit with a push-pull output drive coupled to the current switch by means of a current mirror. Both true and complementary inputs are available at several different levels of drive. Specifically, the push-pull driver formed by transistors T5, T6 and T5', T6' can provide a much higher level of drive (for example, off chip drive) than the internal emitter followers T3 and T4. The overall drive capability of the circuit is adjustable by providing adjustable resistors at R1, R2 and R3. In integrated circuit format, a master slice constructed from circuits such as these provide a great variety of alternatives in the interconnection of the various cells of the master slice. As also previously pointed out, the circuit is readily expandable into other logic configurations by additional transistors T1 placed in parallel with the one shown. Also, additional emmiter followers such as T3 and T4 can be connected to the collectors of T1 and T2.

While the invention has been particularly shown and described with reference to a preferred embodiment thereof, it will be understood by those skilled in the art that there are changes in form and detail which may be made therein, without departing from the spirit and scope of the invention. For example, the conductivity type of the transistors used in the circuit could be reversed with the appropriate changes in the biasing arrangement.

What is claimed is:

1. A circuit comprising:
   a current switch adapted to receive at least one input and providing true/complement first and second outputs;
   a push-pull circuit having first and second inputs and an output, the first input being electrically connected to the first output of said current switch; and
   circuit means including an emitter follower and current mirror transistor electrically coupling the second output of said current switch to the second input of said push-pull circuit, said current mirror transistor having collector, base and emitter regions with said emitter region connected to a fixed potential and said collector and base regions connected in common and coupled to both the emitter output of said emitter follower and to said second input of said push-pull circuit.

2. A circuit as in claim 1 further comprising:
   a resistor network for setting a bias potential to said current mirror transistor, at least one resistor of said resistor network coupling the said emitter output of said emitter follower to said current mirror transistor.

3. A circuit as in claim 2 further comprising:
   a unidirectionally conducting means coupling the said second input of said push-pull circuit to the said output of said push-pull circuit to the said output of said push-pull circuit.

4. A circuit as in claim 3 wherein said unidirectionally conducting means comprises a Schottky Barrier diode.

5. A circuit as in claim 2 wherein said at least one resistor conducts current in a first direction when said emitter follower is turned on and in the opposite direction when said emitter follower is turned off.

6. A circuit as in claim 2 wherein said resistor network comprises:
   first, second, and third resistors connected in a series electrical current path;
   said first resistor being connected between a first voltage source and collector and base regions of said current mirror transistor connected in common; and
   said second resistor being connected between said collector and base regions of said current mirror transistor connected in common and said emitter output of said emitter follower; and
   said third resistor being connected between said second resistor and a second voltage source.

7. A circuit as in claim 1 wherein said push-pull circuit comprises:
   first and second push-pull transistors connected in a series electrical path between first and second voltage sources, the emitter of the first push-pull transistor being connected to the collector of the second push-pull transistor and forming the output for the push-pull circuit, the base of the first push-pull transistor forming the first input, the base of the second transistor forming the second input.

8. A circuit as in claim 7 further comprising:
   a unidirectionally conducting means coupling the base of the first push-pull transistor to the collector of the first push-pull transistor; and
   a resistance coupling the collector of the first push-pull transistor to said first voltage source.

9. A circuit as in claim 1 further comprising:
   disabling means connected to both the said first input and the said second input of said push-pull circuit.

10. A logic circuit comprising:
    a current switch circuit including at least first and second transistors each having emitter, base and collector regions with said emitter regions connected in common to a substantially constant source of current;
    third and fourth transistors each having emitter, base and collector regions with said base regions respectively connected to said collector regions of said first and second transistors and arranged to form emitter follower circuits;
    push-pull driver circuit means including fifth and sixth transistors each having emitter, base and collector regions with the base region of said fifth transistor being coupled to said collector region of said second transistor; and
    current mirror transistor means having emitter, base and collector regions with said base and collector regions commonly coupling the said emitter region of said third transistor to the said base region of said sixth transistor to form a current mirror therewith.

11. A logic circuit as in claim 10 further comprising:
    another push-pull driver having first and second inputs, the first input being coupled to the said collector region of said first transistor; and
    another current mirror transistor means coupling the said emitter region of said fourth transistor to the said second input of said another push-pull driver.

12. A logic circuit as in claim 10 further comprising:
    a resistor network for setting a bias potential to said current mirror, at least one resistor of said resistor network coupling the said emitter region of said third transistor to the said base and collector regions of said current mirror transistor means.

13. A logic circuit as in claim 12 further comprising:
    a unidirectionally conducting means coupling the said base region of said sixth transistor to the said collector region of said sixth transistor.

14. A logic circuit as in claim 12 wherein said at least one resistor conducts current in a first direction when said third transistor is turned on and in the opposite direction when said third transistor is turned off.

15. A logic circuit as in claim 12 wherein said resistor network comprises:
    first, second, and third resistors connected in a series electrical current path;
    said first resistor being connected between a first voltage source and said base and collector regions of said current mirror transistor means;
    said second resistor being connected between said base and collector regions of said current mirror transistor means and the said emitter region of said third transistor; and
    said third resistor being connected between said second resistor and a second voltage source.

16. A logic circuit as in claim 10 further comprising:
    unidirectionally conducting means coupling the said base region of the sixth transistor to the said collector region of said sixth transistor.

17. A logic circuit as in claim 10 further comprising:

a unidirectionally conducting means coupling the said base region of said fifth transistor to the said collector region of said fifth transistor; and a resistance means coupling the said collector region of said fifth transistor to a voltage source.

18. A logic circuit as in claim 10 further comprising:

disabling means connected to the said base regions of said fifth and sixth transistors.

* * * * *